United States Patent [19]

Fushiki et al.

[11] 4,336,297
[45] Jun. 22, 1982

[54] ELECTRICAL LAMINATE

[75] Inventors: Yasuo Fushiki, Takatsuki; Masaharu Abe; Masakazu Uekita, both of Kobe, all of Japan

[73] Assignee: Kanegafuchi Kagaku Kogyo Kabushiki Kaisha, Osaka, Japan

[21] Appl. No.: 143,086

[22] Filed: Apr. 23, 1980

[30] Foreign Application Priority Data

Apr. 27, 1979 [JP] Japan ................... 54/53239

[51] Int. Cl.$^3$ ............................................. B32B 7/00
[52] U.S. Cl. .................................... 428/284; 156/324; 427/302; 428/290; 428/507; 428/514; 428/901; 525/30; 525/518; 525/519; 523/208
[58] Field of Search ............... 156/307.3, 307.5, 307.7, 156/324; 427/302; 525/30, 518, 519; 260/17.3; 428/284, 290, 507, 514, 901

[56] References Cited

U.S. PATENT DOCUMENTS 2,632,744  3/1953  Howard ............................ 260/17.3
3,897,580  7/1975  Nahtomi ............................ 418/285
4,221,821  8/1980  Hammer et al. ................... 260/17.3

*Primary Examiner*—James J. Bell
*Attorney, Agent, or Firm*—Haight & Associates

[57] ABSTRACT

An electrical laminate comprising layers of a polyester resin-impregnated fibrous cellulosic substrate is disclosed. The substrate is preimpregnated with a nitrogen-containing composition having (a) an N-methylol or N-lower alkoxymethyl group attached to said nitrogen atom, and (b) an unsaturated group capable of copolymerizing with a cross-linking monomer present in the polyester resin.

24 Claims, No Drawings

ELECTRICAL LAMINATE

This invention relates to an electrical laminate. Reinforced unsaturated polyester resin laminates find important uses as electrical components such as printed circuit wiring boards. These laminates are conventionally produced by impregnating a fibrous substrate with an unsaturated polyester resin composition (mixture of unsaturated polyester and a cross-linking vinyl monomer), laminating layers of resin-impregnated substrate and curing the resin under heat.

Cellulosic papers have many advantages as substrate for the production of electrical laminates but they tend to pick up moisture excessively, thereby deteriorating the electrical properties of the entire structure. Their affinity to the resin is not necessarily satisfactory. Various attempts have been made to eliminate these defects by treating the paper substrate with waterproof thermosetting resins or by chemically modifying the cellulose molecules of the substrate, for example, with formaldehyde. It has been found, however, that these treatments of paper make the resulting resin laminates excessively stiff and thus adversely affects the punchability of the laminates.

Japanese Patent Publication No. 24121/64 discloses use of cellulose N-acryloylaminomethyl ether as a filler for diallyl phthalate resin compositions. The cellulose ether filler may be prepared by reacting a defibrated cellulosic material such as wood pulp with N-methylolacrylamide in the presence of a catalyst, washing the etherified product and drying. The double bond included in the ether linkage will react with the diallyl phthalate resin to form a cross-linking bond therebetween. Experiments have shown, however, that this chemical modification also adversely affects some mechanical and electrical properties of the resulting laminates.

It is an object of the present invention to provide the electrical laminates of the above-described type which can avoid the foregoing defects.

It is another object of the present invention to provide an electrical laminate which can withstand moist conditions.

It is a further object of the present invention to provide a method for improving the wet properties of an electrical laminate comprising layers of resin-impregnated cellulosic fibrous substrate.

According to the present invention, we have found that these and other objects and advantages may be accomplished by merely preimpregnating the fibrous substrate material with a free or alkylated N-methylol derivative of a nitrogen-containing unsaturated compound capable of copolymerizing with a cross-linking vinyl monomer present in an unsaturated polyester resin composition. Examples of cellulosic fibrous substrate materials which may be used herein include papers made of wood pulp, cotton linter pulp, regenerated cellulose pulp or mixtures thereof, and fabrics made of natural or regenerated cellulose.

The preimpregnating agents which may be used in the present invention fall in one of the following classes.

A. Partially modified N-methylol compounds of amino-S-triazines

They are a reaction product of (a) a hydroxylmethylated amino-S-triazine such as methylol melamine or methylolguanamine, or partially or fully etherified products thereof with a lower alkanol, and (b) a polymerizable unsaturated carboxylic acid such as acrylic acid, methacrylic acid or itaconic acid, or an unsaturated aliphatic alcohol such as allyl alcohol, or an unsaturated carboxamide such as acrylamide or methacrylamide, or an unsaturated epoxy compound such as glycidyl methacrylate.

Alternatively mixtures of (a) said free or etherified hydroxymethylated amino-S-triazine and (b) said unsaturated carboxylic acid, unsaturated aliphatic alcohol, unsaturated carboxamide or unsaturated epoxide may be used and are allowed to react with each other in situ.

B. A compound of the formula

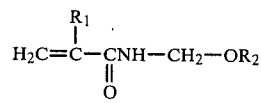

wherein $R_1$ is a hydrogen atom or methyl, and $R_2$ is a hydrogen atom or alkyl of 1 to 4 carbon atoms.

Examples of these compounds include N-methylolacrylamide, N-methoxymethylacrylamide, N-butoxymethylacrylamide, N-methylolmethacrylamide, N-methoxymethylmethacrylamide and N-butoxymethylmethacrylamide. Mixtures of these monomers or condensates of two or more different monomers may also be used.

The preimpregnation of a cellulosic substrate with the foregoing chemicals in accordance with the present invention greatly improves the adhesion of the cellulosic substrate layers to the unsaturated polyester resin layers in the finished laminate, and also effectively prevents the decrease in both mechanical and electrical properties of the resulting laminate under wet conditions. It is postulated that this is because the preimpregnating agents of the present invention possess not only a reactive group with cellulose molecules on the one hand, but also a reactive group with unsaturated polyester resin composition on the other hand, and thus these reactive groups are chemically bound with respective components when the laminate is fully cured.

In contradistinction, experiments have shown that preimpregnation of cellulosic substrates with a chemical having either N-methylol groups alone or polymerizable unsaturated groups alone has no or little effect.

The preimpregnating agents of the present invention are used as a solution in a suitable solvent such as water, lower alkanols, ketones or esters. The concentration of the preimpregnating chemicals is preferably adjusted to obtain a pick-up from about 3 to about 30% by weight, more preferably from about 6 to about 20% by weight of the substrate. A pick-up less than 3% by weight is not effective and excessive pick-ups adversely affect the mechanical properties, especially punchability of the resulting laminate. The solution may contain, if desired, other components such as polymerization inhibitors, polymerization catalysts, surfactants, plasticizers, and the like.

The preimpregnation may be carried out by any conventional technique such as dipping the substrate into the solution, or applying the solution onto the surface of a substrate by a roller coater or a spray machine, and then drying the substrate. The drying conditions may be such that only evaporation of the solvent used takes place. It is not necessary to heat the treated substrate to a temperature at which etherification of cellulose molecules with methylol groups of the preimpregnation chemicals takes place prior to the final curing step, although this pre-etherification may be accelerated, if desired, by adding a catalytic amount of an acid to the impregnation solution. Since no additional advantage can be derived from this pre-etherification, it is desirable to impregnate the cellulosic substrate with a catalyst-free solution of the preimpregnation chemical and then merely evaporate the solvent.

Any conventional unsaturated polyester resin composition may be used in the final impregnation of the preimpregnated cellulosic substrate. Preferably the polyester resin may be a liquid at room temperature, although a solid resin may be also used in the form of a solution. The resin composition comprises an unsaturated polyester resin and a cross-linking vinyl monomer. As is well-known in the art, the unsaturated polyester resins are a reaction product of (a) a polyhydric alcohol such as ethyleneglycol, propyleneglycol, diethyleneglycol, 1,4-butanediol, or 1,5-pentanediol with (b) an unsaturated polycarboxylic acid such as maleic anhydride or fumaric acid, and (c) a saturated polycarboxylic acid such as phthalic anhydride, isophthalic acid, terephthalic acid, adipic acid, sebatic acid or azelaic acid. The condensate typically has a recurring unit of the formula:

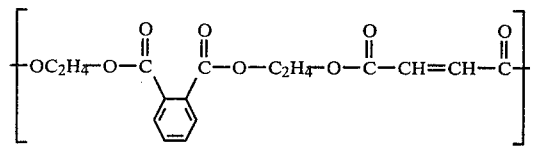

Examples of the cross-linking vinyl monomer include styrene, α-methylstyrene, vinyltoluene, chlorostyrene, divinylbenzene, $C_1$–$C_{10}$ alkyl acrylate, $C_1$–$C_{10}$ alkyl methacrylates and the like. Styrene is most preferable. The resin composition preferably contains about 20 to 50 weight % of the monomer in the entire resin composition and has a viscosity of 0.1 to 15 poise, preferably 0.5 to 10 poise at room temperature. The resin composition also contains a conventional curing catalyst such as an organic peroxide and optionally a curing accelerator such as a cobalt compounds.

The final impregnation of the substrate with the resin composition and the subsequent steps for lamination and curing may be carried out under heat and pressure in any conventional manner which is well-known in the art, or in continuous manner without applying pressure as disclosed in a co-pending application of Masana Gotou et al., Ser. No. 06/132,500, filed Mar. 21, 1980, assigned to the same assignee as the present application, to which reference is made as a part of disclosure hereof.

If a clad laminate is desired, a cladding metal foil such as electrolytic copper foil may be adhesively bonded onto one or both sides of the laminate prior to the curing step.

To further illustrate the invention, the following non-limiting examples are presented. Unless otherwise indicated all parts and percentages are by weight.

EXAMPLE 1

A kraft paper of 235 μm thick was soaked in a 8% methanolic solution of N-methylolacrylamide for 5 minutes, air-dried at room temperature for 30 minutes and dried at 100° C. for 20 minutes. The pick-up amount of N-methylolacrylamide was 11.2% based on the dry weight of paper.

An unsaturated polyester resin polymer having an average molecular weight of about 3,500 was prepared by reacting diethyleneglycol, isophthalic acid and fumaric acid in a molar ratio of 3:2:1. To 64 parts of the resin polymer were mixed 36 parts of styrene monomer, 1 part of cumene hydroperoxide as a catalyst, and 0.5 parts of 5% cobalt naphthenate as an accelerator.

The preimpregnated paper was finally impregnated with the above resin-monomer mixture and six plies of the finally impregnated paper substrate were stacked. Simultaneously an electrolytic copper foil 35 μm thick was adhesively bonded onto one side of the stack with an epoxy resin. The entire structure was then cured at 100° C. for 45 minutes under pressure to give a copper clad laminate of 1.6 mm thick. Properties of the finished laminate are shown in Table I.

EXAMPLE 2

30 parts of methylated trimethylolmelamine (SUMITEX RESIN M-3, Sumitomo Chemical Co., Ltd., Osaka, Japan) and 20 parts of acrylamide were added to 100 parts of water. The mixture was heated at 80° C. To the reaction mixture were added 5 parts of itaconic acid and 900 parts of methanol.

The same kraft paper as used in Example 1 was preimpregnated with the above solution to obtain a pick-up amount of 11.9%. Then Example 1 was followed to obtain a copper clad laminate 1.6 mm thick. Properties of the finished laminate are shown in Table I.

EXAMPLE 3

8 parts of methylated trimethylolmelamine (SUMITEX RESIN M-3, Sumitomo Chemical Co., Ltd.), 2 parts of acrylamide and 0.5 parts of itaconic acid were dissolved in 100 parts of methanol.

The same kraft paper as used in Example 1 was preimpregnated with the above solution to obtain a pick-up amount of 10.2%. Then Example 1 was followed to obtain a copper clad laminate 1.6 mm thick. Properties of the finished laminate are shown in Table I.

CONTROL 1

Example 1 was followed to obtain a copper clad laminate 1.6 mm thick except that the kraft paper was directly impregnated with the resin-monomer mixture without subjecting it to any preimpregnating treatment. Properties of the finished laminate are shown in Table I.

CONTROL 2

Example 1 was followed to obtain a copper clad laminate 1.6 mm thick except that an 8% methanolic solution of acrylamide was used in the preimpregnating step to obtain a pick-up amount of 10.8%. Properties of the finished laminate are shown in Table I.

CONTROL 3

Example 1 was followed to obtain a copper clad laminate 1.6 mm thick except that an 8% methanolic solution of N-methylolmelamine methyl ether (SUMITEX RESIN M-3) was used in the preimpregnating step to obtain a pick-up amount of 13.1%. Properties of the finished laminate are shown in Table I.

CONTROL 4

To 100 parts of 8% methanolic solution of N-methylolacrylamide was added 0.5 parts of ammonium chloride. The same kraft paper as used in Example 1 was soaked in the solution for 5 minutes, air-dried at room temperature for 30 minutes, and then cured at 100° C. for 1 hour. The treated paper was extracted and washed with methanol to remove unreacted N-methylolacrylamide and catalyst.

Thereafter Example 1 was followed to obtain a copper clad laminate 1.6 mm thick. Properties of the finished laminate are shown in Table I.

TABLE I

| | Surface resistivity, Ohm/cm² | | Solder dip resistance, 260° C., sec. | | Clad peel strength, kg/cm | | Moisture pick-up, % |
|---|---|---|---|---|---|---|---|
| | Normal C-90/20/65 | After moisture pick-up C-96/40/94 | Normal C-90/20/65 | After moisture pick-up C-96/40/94 | Normal C-90/20/65 | After moisture pick-up C-96/40/94 | E-24/50 +D-24/23 |
| Example 1 | $4 \times 10^{12}$ | $2 \times 10^{10}$ | 45 | 28 | 1.5 | 1.4 | 1.6 |
| Example 2 | $5 \times 10^{12}$ | $9 \times 10^{9}$ | 37 | 22 | 1.6 | 1.3 | 1.3 |
| Example 3 | $4 \times 10^{12}$ | $7 \times 10^{9}$ | 41 | 20 | 1.5 | 1.3 | 1.3 |
| Control 1 | $6 \times 10^{12}$ | $4 \times 10^{8}$ | 33 | 4 | 1.5 | 0.5 | 2.5 |
| Control 2 | $4 \times 10^{12}$ | $5 \times 10^{8}$ | 38 | 5 | 1.5 | 0.6 | 2.7 |
| Control 3 | $6 \times 10^{12}$ | $1 \times 10^{9}$ | 35 | 10 | 1.7 | 0.9 | 2.1 |
| Control 4 | $4 \times 10^{12}$ | $3 \times 10^{9}$ | 42 | 14 | 1.6 | 1.4 | 2.0 |

All measurments were made according to JIS-C6481.

The above has been offered for illustrative purposes only, and it is not for the purpose of limiting the scope of this invention, which is as defined in the claims below.

We claim:

1. In an electrical laminate suitable for use as a printed circuit wiring board comprising layers of a resin impregnated fibrous cellulosic substrate, said resin being a cured product of a mixture comprising an unsaturated polyester polymer and a cross-linking vinyl monomer therefor, the improvement which comprises said fibrous cellulose substrate being pre-impregnated with a solution consisting essentially of a nitrogen-containing composition having (a) a free or lower-alkylated methylol group attached to said nitrogen atom capable of etherifying with said cellulose substrate, and (b) an unsaturated group capable of copolymerizing with said cross-linking monomer.

2. The electrical laminate of claim 1, wherein said nitrogen-containing composition is a partially modified product of (a) N-methylolamino-S-triazine or an ether thereof with a lower alkanol reacted with (b) an unsaturated compound capable of copolymerizing with said cross-linking monomer and also of modifying said methylol group.

3. The electrical laminate of claim 2, wherein said nitrogen-containing composition is a reaction produt between (a) N-methylolamino-S-triazine or an ether thereof with a lower alkanol, and (b) an unsaturated carboxylic acid, an unsaturated aliphatic alcohol, an unsaturated carboxamide, or an unsaturated epoxy compound.

4. The electrical laminate of claim 1, wherein said nitrogen-containing composition is a mixture of (a) N-methylolamino-S-trazine or an ether thereof with a lower alkanol, and (b) an unsaturated compound capable of copolymerizing with said cross-linking monomer and also of modifying said methylol group.

5. The electrical laminate of claim 4, wherein said nitrogen-containing composition is a mixture of (a) N-methylolamino-S-triazine or an ether thereof with a lower alkanol, and (b) an unsaturated carboxylic acid, an unsaturated aliphatic alcohol, an unsaturated carboxamide, or an unsaturated epoxy compound.

6. The electrical laminate of claim 1, wherein said nitrogen-containing composition comprises a compound of the formula:

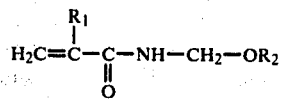

wherein $R_1$ is hydrogen or methyl, and $R_2$ is hydrogen or $C_1$-$C_4$ alkyl.

7. The electrical laminate of claim 3, wherein said nitrogen-containing composition is a partially modified reaction product of trimethylolmelamine or its methyl ether with acrylamide.

8. The electrical laminate of claim 5, wherein said nitrogen-containing composition is a mixture of trimethylolmelamine or its methyl ether and acrylamide.

9. The electrical laminate of claim 6, wherein said nitrogen-containing composition is N-methylolacrylamide.

10. The electrical laminate of claim 1, wherein said fibrous cellulosic substrate is cellulosic paper.

11. The electrical laminate of claim 1, wherein said fibrous cellulosic substrate is preimpregnated with said nitrogen-containing composition to a pick-up from about 3 to about 30% by weight of the substrate.

12. The electrical laminate of claim 1 further comprising a cladding metal foil adhesively bonded onto at least one side of said laminate.

13. In a process for producing a reinforced electrical laminate suitable for use as a printed circuit wiring board comprising the steps of impregnating a fibrous cellulosic substrate with a resin composition comprising an unsaturated polyester polymer and a cross-linking vinyl monomer therefor, laminating layers of the impregnated substrate into a unitary member and curing the laminate, the improvement comprising the steps of preimpregnating said fibrous cellulosic substrate with a solution consisting essentially of a nitrogen-containing composition having (a) a free or lower alkylated methylol group attached to said nitrogen atom capable of etherifying with said cellulosic substrate, and (b) an unsaturated group capable of copolymerizing with said cross-linking monomer, prior to the impregnation with said resin composition, and then drying the substrate to remove the solvent.

14. The process of claim 13, wherein said nitrogen-containing composition is a partially modified product of (a) N-methylolamino-S-triazine or an ether thereof with a lower alkanol reacted with (b) an unsaturated compound capable of copolymerizing with said cross-linking monomer and also of modifying said methylol group.

15. The process of claim 14, wherein said nitrogen-containing composition is a reaction product between (a) N-methylolamino-S-triazine or an ether thereof with a lower alkanol, and (b) an unsaturated carboxylic acid, an unsaturated aliphatic alcohol, an unsaturated carboxamide, or an unsaturated epoxy compound.

16. The process of claim 13, wherein said nitrogen-containing composition is a mixture of (a) N-methylolamino-S-triazine or an ether thereof with a lower alkanol, and (b) an unsaturated compound capable of copolymerization with said cross-linking monomer and also of modifying said methylol group.

17. The process of claim 16, wherein said nitrogen-containing composition is a mixture of (a) N-methylolamino-S-triazine or an ether thereof with a lower alkanol, and (b) an unsaturated carboxylic acid, an unsaturated aliphatic alcohol, an unsaturated carboxamide, or an unsaturated epoxy compound.

18. The process of claim 11, wherein said nitrogen-containing composition comprises a compound of the formula:

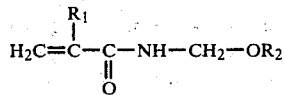

wherein $R_1$ is hydrogen or methyl, and $R_2$ is hydrogen or $C_1$–$C_4$ alkyl.

19. The process of claim 15, wherein said nitrogen-containing composition is a partially modified reaction product of trimethylolmelamine or its methyl ether with acrylamide.

20. The process of claim 17, wherein said nitrogen-containing composition is a mixture of trimethylolmelamine or its methyl ether and acrylamide.

21. The process of claim 18, wherein said nitrogen-containing composition is N-methylolacrylamide.

22. The process of claim 13, wherein said fibrous cellulosic substrate is paper.

23. The process of claim 13, wherein said fibrous cellulose substrate is preimpregnated with said nitrogen-containing composition to a pick-up from about 3 to about 30% by weight of the substrate.

24. The process of claim 13 further comprising the steps of adhesively bonding a cladding metal foil onto at least one side of the laminate prior to the curing step.

* * * * *